United States Patent
Deliwala

(10) Patent No.: US 10,969,254 B2
(45) Date of Patent: Apr. 6, 2021

(54) FIBER BRAGG GRATING INTERROGATION AND SENSING SYSTEM AND METHODS COMPRISING A FILTER CENTERED AT A FIRST WAVELENGTH

(71) Applicant: Analog Devices, Inc., Norwood, MA (US)

(72) Inventor: Shrenik Deliwala, Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/880,109

(22) Filed: May 21, 2020

(65) Prior Publication Data
US 2020/0284621 A1    Sep. 10, 2020

Related U.S. Application Data

(63) Continuation of application No. 16/136,223, filed on Sep. 19, 2018, now Pat. No. 10,663,325.

(60) Provisional application No. 62/560,593, filed on Sep. 19, 2017.

(51) Int. Cl.
| | |
|---|---|
| *G01D 5/353* | (2006.01) |
| *G02B 6/42* | (2006.01) |
| *G02B 6/02* | (2006.01) |
| *H01L 31/167* | (2006.01) |
| *G02B 6/293* | (2006.01) |

(52) U.S. Cl.
CPC ....... *G01D 5/35316* (2013.01); *G02B 6/0208* (2013.01); *G02B 6/4215* (2013.01); *H01L 31/167* (2013.01); *G02B 6/02138* (2013.01); *G02B 6/29319* (2013.01); *G02B 6/4231* (2013.01)

(58) Field of Classification Search
CPC .............. G01D 5/35316; G02B 6/0208; G02B 6/4215; G02B 6/4231; H01L 31/167
USPC ........................................ 250/227.18, 227.23
See application file for complete search history.

(56) References Cited

U.S. PATENT DOCUMENTS 5,308,919 A * 5/1994 Minnich ................... A61B 5/00
                                                            128/633

* cited by examiner

*Primary Examiner* — Que Tan Le
(74) *Attorney, Agent, or Firm* — Patent Capital Group

(57) ABSTRACT

Fiber Bragg grating interrogation and sensing used for strain and temperature measurements. A simple, broadband light source is used to interrogate one or more fiber Bragg grating (FBG). Specifically, a packaged LED is coupled to fiber, the light therefrom is reflected off a uniform FBG. The reflected light is subsequently analyzed using a filter and a plurality of Si photodetectors. In particular, the filter is a chirped FBG or an optically coated filter, in accordance with some embodiments. Measurement analysis is performed by ratio of intensities at the plurality of detectors, at least in part.

20 Claims, 13 Drawing Sheets

FIBER BRAGG GRATING INTERROGATION AND SENSING SYSTEM AND METHODS COMPRISING A FILTER CENTERED AT A FIRST WAVELENGTH

CROSS-REFERENCE TO RELATED APPLICATIONS

This application is a Continuation of U.S. patent application Ser. No. 16/136,223 entitled, "FIBER BRAGG GRATING INTERROGATION AND SENSING SYSTEM AND METHODS COMPRISING A FIRST PHOTODETECTOR FOR MEASURING FILTERED LIGHT AND A SECOND PHOTODETECTOR FOR MEASURING UNFILTERED LIGHT" now U.S. Pat. No. 10,663,325 which is related and claims priority to U.S. Provisional Application No. 62/560,593 entitled, "FIBER BRAGG GRATING INTERROGATION AND SENSING SYSTEM AND METHODS" filed on Sep. 19, 2017, all of which are hereby incorporated by reference in its entirety. This application is also related to U.S. Pat. Nos. 8,538,215 and 9,348,088 entitled, "Optical Package and Related Methods" and "Systems and methods for passive alignment of optoelectronic components," respectively, which are hereby incorporated by reference in their entirety.

FIELD OF THE DISCLOSURE

The present disclosure relates to fiber Bragg grating sensing and interrogation used in strain measurement. More specifically, this disclosure describes apparatus and techniques relating to using a commonly available interrogator source and methods of measurement thereof.

BACKGROUND

Fiber Bragg grating (FBG) sensors have been playing a vital role in many industrial applications owing to their high sensitivity, fast response, immunity to electromagnetic interference, high reliability, distributed and multiplexing capability, and multiparameter sensing. The past decade has seen a tremendous growth in the number of FBG-based sensor systems. Nowadays, temperature and strain measurement encompass a wide variety of needs and applications in scientific fields, aerospace, metallurgical and civil engineering, solar panels, nuclear power, shipping, petroleum, and thermal power industries.

A fiber Bragg grating (FBG) is a type of distributed Bragg reflector constructed in a short segment of optical fiber that reflects particular wavelengths of light and transmits all others. This is achieved by adding a periodic variation to the refractive index of the fiber core, which generates a wavelength specific dielectric mirror. A fiber Bragg grating can therefore be used as an inline optical filter to block certain wavelengths, or as a wavelength-specific reflector.

Fiber Bragg Gratings are made by laterally exposing the core of a single-mode fiber to a periodic pattern of intense ultraviolet light. The exposure produces a permanent increase in the refractive index of the fiber's core, creating a fixed index modulation according to the exposure pattern. This fixed index modulation is called a grating. At each periodic refraction change a small amount of light is reflected. All the reflected light signals combine coherently to one large reflection at a particular wavelength when the grating period is approximately half the input light's wavelength. This is referred to as the Bragg condition, and the wavelength at which this reflection occurs is called the Bragg wavelength. Light signals at wavelengths other than the Bragg wavelength, which are not phase matched, are essentially transparent.

Sensing technologies based on optical fiber have several inherent advantages that make them attractive for a wide range of industrial sensing applications. They are typically small in size, passive, immune to electromagnetic interference, resistant to harsh environments and have a capability to perform distributed sensing. Because of their telecommunication origins, fiber optic-based sensors can be easily integrated into large scale optical networks and communications systems.

Although developed initially for the telecommunications industry in the late 1990's, fiber Bragg gratings (FBGs) are increasingly being used in sensing applications and are enjoying widespread acceptance and use. The FBG is an optical filtering device that reflects light of a specific wavelength and is present within the core of an optical fiber waveguide. The wavelength of light that is reflected depends on the spacing of a periodic variation or modulation of the refractive index that is present within the fiber core. This grating structure acts as a band-rejection optical filter passing all wavelengths of light that are not in resonance with it and reflecting wavelengths that satisfy the Bragg condition of the core index modulation. The Nobel Laureate Sir William Lawrence Bragg established the Bragg law in 1915, describing with a simple mathematical formula how X-Rays were diffracted from crystals. The Bragg condition, when applied to fiber Bragg gratings, states that the reflected wavelength of light from the grating is:

$$\lambda_B = 2 \cdot n_{eff} \cdot \Lambda_G$$

where, $n_{eff}$ is the effective refractive index seen by the light propagating down the fiber and $\Lambda_G$ is the period of the index modulation that makes up the grating.

Fiber Bragg gratings (FBGs) are widely used as sensing elements for the measurement of physical parameters such as strain, pressure and temperature. The variation of these parameters induces changes of the central Bragg wavelength. The precise measurement of this wavelength change is crucial for achieving good sensor performance.

Several interrogation techniques based on bulk filters, fiber edge filters, edge optical spectra, edge fiber grating spectra, edge detector spectral responses, tunable fiber filters, tunable acousto-optic filters, tunable single mode laser diodes, receiving FBGs, interferometric detection, fiber lasers and Fourier techniques have been proposed.

An FBG illuminated by a broadband light source reflects a particular narrow band wavelength called Bragg wavelength and transmits all others. The Bragg wavelength is mainly dependent on applied temperature and strain. In general, the Bragg wavelength shift of FBG is monitored by using an optical spectrum analyzer (OSA). However, OSA has its own limitations in response time, resolution, weight, size, and cost. To overcome these issues, different interrogation techniques have been developed.

A more recent advance is the use of a simple technique based on converting the wavelength information into its equivalent intensity modulated signal which can be measured by using a photodiode with simple electronics. However, the inventor of the present disclosure has recognized the need for a more robust, low cost FBG sensor which exploits this technique.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY OF THE DISCLOSURE

Fiber Bragg grating interrogation and sensing used for strain and temperature measurements. A simple, broadband light source is used to interrogate one or more fiber Bragg grating (FBG). Specifically, a packaged LED is coupled to fiber, the light therefrom is reflected off a uniform FBG. The reflected light is subsequently analyzed using a filter and a plurality of Si photodetectors. In particular, the filter is a chirped FBG in accordance with some embodiments.

In other embodiments, the filter is an optical coated filter. Measurement analysis is performed by ratio of intensities at the plurality of detectors, at least in part. According to one aspect, the present disclosure is a system for measuring strain or temperature comprising a broadband light source, one or more splitter/couplers, a fiber Bragg grating, an optical filter and 2 or more optical detectors.

According to one aspect of the disclosure, a method for interrogating a fiber Bragg grating is disclosed. The method comprises powering a light source with a current, illuminating a fiber Bragg grating with a light pulse, and reflecting a portion of the light pulse centered a first wavelength $\lambda_1$.

According to another aspect of the disclosure, the method further comprises separating the portion of the light pulse centered at a first wavelength $\lambda_1$ into a first and second intensity.

According to another aspect of the disclosure, the method further comprises filtering the first intensity with a filter centered at a second wavelength $\lambda_2$.

According to another aspect of the disclosure, the method further comprises measuring the filtered first intensity and measuring the second intensity.

According to another aspect of the disclosure, the method further comprises calculating a change in the fiber Bragg grating using the measurement of the first and second intensity.

According to another aspect of the disclosure, the method further qualifies that the light source comprises a first light emitting diode have a spectral intensity centered about a third wavelength, $\lambda_3$.

According to another aspect of the disclosure, the method further qualifies that the light source further comprises a second light emitting diode have a spectral intensity centered about a fourth wavelength, $\lambda_4$.

According to another aspect of the disclosure, the method further qualifies that the light source further comprises a second light emitting diode have a spectral intensity centered about a fourth wavelength, $\lambda_4$.

According to another aspect of the disclosure, the method further qualifies that the filtering the first intensity with a filter centered at a second wavelength $\lambda_2$ is performed with an optically coated filter.

According to another aspect of the disclosure, the method further qualifies that the filtering the first intensity with a filter centered at a second wavelength $\lambda_2$ is performed with a chirped fiber Bragg grating.

According to another aspect of the disclosure, the method further comprising calculating a ratio of the first and second intensity.

According to another aspect of the disclosure, the method further qualifies that an analog front-end performs the calculation.

According to another aspect of the disclosure, the method further qualifies that the ratio is calculated by the following:

$$R = \frac{I_{D1} - I_{D2}}{I_{D1} + I_{D2}}$$

where, I is the current received from two detectors $D_1$ and $D_2$.

According to another aspect of the disclosure, the method further qualifies that the measuring the filtered first intensity and measuring the second intensity is performed using a first photodetector and second photodetector, respectively.

According to another aspect of the disclosure, the system for interrogating a fiber Bragg grating is disclosed comprising a light source, a fiber Bragg grating centered at a first wavelength $\lambda_1$ which is illuminated by the light source, and a filter centered at a second wavelength $\lambda_2$, the filter filters the light reflected from the fiber Bragg grating.

According to another aspect of the disclosure, the system further comprises a first photodetector, wherein the first photodetector measures the filtered light.

According to another aspect of the disclosure, the system further comprises a second photodetector, wherein the second photodetector measures unfiltered light.

According to another aspect of the disclosure, the system further comprising an analog front-end configure to perform calculations on the measurements from the first and second photodetector.

According to another aspect of the disclosure, the system further qualifies that the calculations include estimating a ratio from the first and second photodetector.

According to another aspect of the disclosure, the system further qualifies that the wherein the ratio is calculated by the following:

$$R = \frac{I_{D1} - I_{D2}}{I_{D1} + I_{D2}}$$

where I is the current received from two detectors $D_1$ and $D_2$.

According to another aspect of the disclosure, the system further qualifies that the calculations include calculating a change in the fiber Bragg grating using the measurement of the first and second photodetector and predetermined properties of the filter.

According to another aspect of the disclosure, the system further qualifies that the first and second photo detectors are photodiodes.

According to another aspect of the disclosure, the system further qualifies that the light source in a light emitting diode.

According to another aspect of the disclosure, the system further qualifies that the filter is a chirped fiber Bragg grating.

According to another aspect of the disclosure, the system further qualifies that the filter is an optical interference filter.

According to another aspect of the disclosure, the system further qualifies that the filter is an optical dichroic filter.

According to one or more aspects of the present disclosure, an apparatus for interrogating a fiber Bragg grating is disclosed comprising a means for powering a light source with a current, a means for illuminating a fiber Bragg grating with a light pulse, and a means for reflecting a portion of the light pulse centered a first wavelength $\lambda_1$.

According to another aspect of the disclosure, the apparatus further comprises a means for separating the portion of the light pulse centered at a first wavelength $\lambda_1$ into a first and second intensity.

According to another aspect of the disclosure, the apparatus further comprises a means for filtering the first intensity with a filter centered at a second wavelength $\lambda_2$.

According to another aspect of the disclosure, the apparatus further comprises a means for measuring the filtered first intensity and a means for measuring the second intensity.

According to another aspect of the disclosure, the apparatus further comprises a means for calculating a change in the fiber Bragg grating using the measurement of the first and second intensity.

According to another aspect of the apparatus in the present disclosure, the broadband light source is a light emitting diode (LED).

According to another aspect of the apparatus in the present disclosure, the system is for interrogating a fiber Bragg grating sensor.

According to another aspect of the apparatus in the present disclosure, the splitter/coupler are optical circulators.

According to another aspect of the apparatus in the present disclosure, the FBG is uniform.

According to another aspect of the apparatus in the present disclosure, the optical filter is a chirped FBG.

According to another aspect of the apparatus in the present disclosure, the optical filter is an add/drop filter.

According to another aspect of the apparatus in the present disclosure, the filter is a dichroic mirror.

According to another aspect of the apparatus in the present disclosure, the plurality of optical detectors are Silicon photodetectors.

According to yet another aspect of the present disclosure, a method for determining FBG sensing measurement comprises edge detection.

According to yet another aspect of the present disclosure, a method for determining FBG sensing measurement comprises ratio of intensities.

The drawings show exemplary FPGs circuits, systems and configurations. Variations of these systems, for example, changing the positions of, adding, or removing certain elements from the circuits are not beyond the scope of the present invention. The illustrated FPG devices and configurations are intended to be complementary to the support found in the detailed description.

BRIEF DESCRIPTION OF THE DRAWINGS

For a fuller understanding of the nature and advantages of the present invention, reference is made to the following detailed description of preferred embodiments and in connection with the accompanying drawings, in which.

DETAILED DESCRIPTION

The present disclosure relates to fiber Bragg grating sensing and interrogation used in strain measurement. More specifically, this disclosure describes apparatus and techniques relating to using a commonly available interrogator source and methods of measurement thereof.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

Because of their small size, passive nature, immunity to electromagnetic interference, and capability to directly measure physical parameters such as temperature and strain, fiber Bragg grating sensors have developed beyond a laboratory curiosity and are becoming a mainstream sensing technology.

Fiber Bragg Gratings and other optical transducers convert physical changes of displacement or bending or stretching to change in the reflectance or the transmission spectrum. Many types of such transducers have been invented and they range from Fabry-Perot interferometers to chirped linear gratings to fiber Bragg gratings (FBG). FBG's are especially popular because they are robust, easy to install, and can be designed to provide reflectance or transmission depending on the application. The disadvantage of the FBG's—and of many other optical transducers—is that they provide a relatively small change in the spectrum (either in reflection or transmission mode) relative to the change in strain or temperature or any other physical parameter that changes the Bragg structure. This generally requires that a high wavelength resolution to measure changes. Many methods to measure these changes are proposed in the present disclosure.

FBG is used as an illustrative example of providing highly sensitive transducer to convert changes in the environment to changes in the wavelength spectrum. The technique presented here can be used with many other optical devices that perform the same function such as grating or a Fabry-Pero interferometer.

Figure 1:
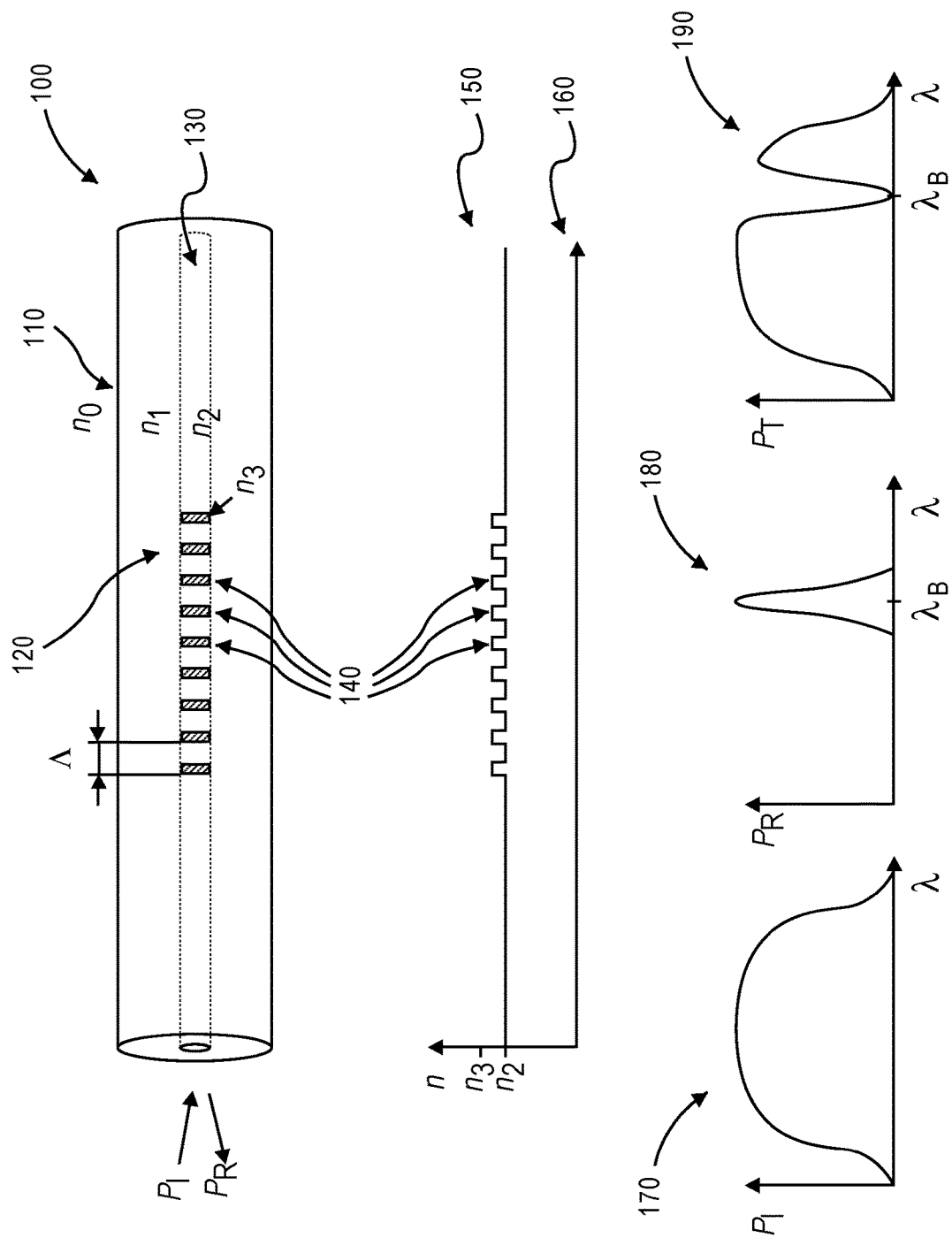
FIG. 1 shows an exemplary fiber Bragg grating fiber including reflectance and transmission response as a function of wavelength, in accordance with some embodiments of the disclosure provided herein.

FIG. 1 shows an exemplary fiber Bragg grating fiber 100 including reflectance and transmission response, 180, 190, respectively as a function of wavelength, in accordance with some embodiments of the disclosure provided herein. A fiber Bragg grating (FBG) is a microstructure typically a few millimeters in length that can be photo inscribed in the core 130 of a single mode fiber. This is done by transversely illuminating the fiber with a UV laser beam and using a phase mask to generate an interference pattern in its core.

This will induce a permanent change in the physical characteristics of the silica matrix. This change consists in a spatial periodic modulation of the core 130 index of refraction that creates a resonant structure. Protected with a primary coating/buffer 110, the diameter of the total fiber is 250 micrometers. Without this coating, the fiber has a diameter of 125 micrometers measured around the cladding 120. The light then travels within the core 130, which has a diameter of approximately 8 micrometers.

A fiber Bragg grating (FBG) is a type of distributed Bragg reflector constructed in a short segment of optical fiber that reflects particular wavelengths of light and transmits all others. This is achieved by creating a periodic variation 140 in the refractive index 160 of the fiber core 130, which generates a wavelength-specific dielectric mirror. A fiber Bragg grating 100 can therefore be used as an inline optical filter to block certain wavelengths, or as a wavelength-specific reflector.

As a resonant structure, the FBG 100 will act as a wavelength selective mirror; it is a narrow band filter. This means that if light from a broadband source 170 is injected in the optical fiber 100, only light within a very narrow spectral width AB centered at the Bragg wavelength will be back-reflected by the grating, as illustrated by the reflectance response 180. The remaining light will continue through the optical fiber to the next Bragg grating (not shown) without experiencing any loss. The Power transmitted is depicted in 190 through the optical fiber 100.

The fundamental principle behind the operation of an FBG is Fresnel reflection, where light traveling between media of different refractive indices may both reflect and refract at the interface. The refractive index will typically alternate over a defined length. The reflected wavelength, $\lambda_B$, called the Bragg wavelength, is defined by the relationship, $\lambda_B = 2 \cdot n_{eff} \cdot \Lambda_G$, where, $n_{eff}$ is the effective refractive index seen by the light propagating down the fiber and $\lambda_G$ is the period of the index modulation that makes up the grating.

The effective refractive index quantifies the velocity of propagating light as compared to its velocity in vacuum. $n_{eff}$ depends not only on the wavelength but also (for multimode waveguides) on the mode in which the light propagates. For this reason, it is also called modal index.

Turning to FIG. 1, $\Lambda$ represents the periodicity in a uniformed fiber Bragg grating 100. In general, $n_3 > n_2 > n_1 > n_0$. This engenders a condition whereby FPG acts a wavelength dependent mirror while not allowing energy to escape through the cladding (i.e., total internal reflection). The incident power, PI, decomposes in to two constituent parts, $P_R$ and $P_T$, where $P_R$ and $P_T$ is the power reflected and the power transmitted, respectively. Light centered around $\lambda_B$ is reflected back towards in ingress of the FBG. Conversely, all other light not centered around $\lambda_B$ passes through the FBG and egresses.

The Bragg wavelength $\lambda_B$ is defined by the period 140 of the microstructure and the index of refraction 160 of the core 130. A typical FBG is a symmetric structure, so it will always reflect light at the Bragg wavelength no matter which side the light is coming from.

Fiber Bragg gratings are created by inscribing or writing systematic (periodic or aperiodic) variation of refractive index into the core of a special type of optical fiber using an intense ultraviolet (UV) source such as a UV laser. Two main processes are used: interference and masking. The method that is preferable depends on the type of grating to be manufactured. Normally a germanium-doped silica fiber is used in the manufacture of fiber Bragg gratings. The germanium-doped fiber is photosensitive, which means that the refractive index of the core changes with exposure to UV light.

The amount of the change depends on the intensity and duration of the exposure as well as the photosensitivity of the fiber. To write a high reflectivity fiber Bragg grating directly in the fiber the level of doping with germanium needs to be high. However, standard fibers can be used if the photosensitivity is enhanced by pre-soaking the fiber in hydrogen. More recently, fiber Bragg gratings have also been written in polymer fibers.

Figure 2:
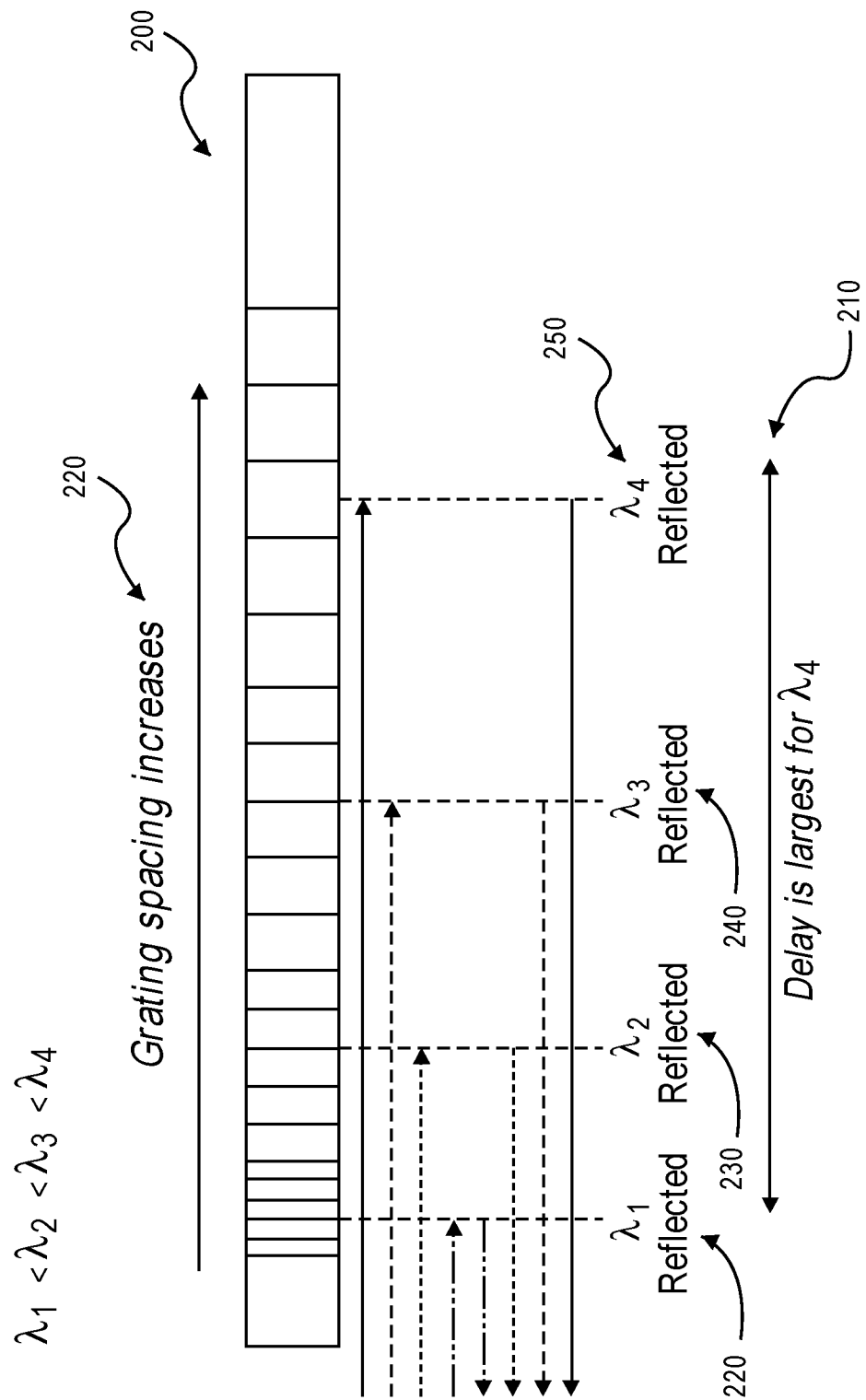
FIG. 2 shows an exemplary chirped fiber Bragg grating fiber demonstrating effect on multiple wavelengths, in accordance with some embodiments of the disclosure provided herein.

FIG. 2 shows an exemplary chirped fiber Bragg grating fiber 200 demonstrating effect on multiple wavelengths $\lambda_1$ 220, $\lambda_2$ 230, $\lambda_3$ 240, $\lambda_4$ 250, etc. in accordance with some embodiments of the disclosure provided herein. The refractive index profile 220 of the grating may be modified to add other features, such as a linear variation in the grating period, called a chirp. The reflected wavelength changes with the grating period, broadening the reflected spectrum. A grating possessing a chirp has the property of adding dispersion—namely, different wavelengths, e.g., $\lambda_1$ through 4, reflected from the grating will be subject to different delays 210. This property has been used in the development of phased-array antenna systems and polarization mode dispersion compensation, as well.

Those in the art will appreciate that the result of a chirped FPG broadens the spectrum of reflected light. Consequently, this produces an anti-dispersive relation in the time domain. However, it is noted that group delays should also be accounted for. That is, time delay for $\lambda_4 > \lambda_3 > \lambda_2 > \lambda_1$. The utilization of uniform and chirped FPGs will now be discussed in detail.

Figure 3:
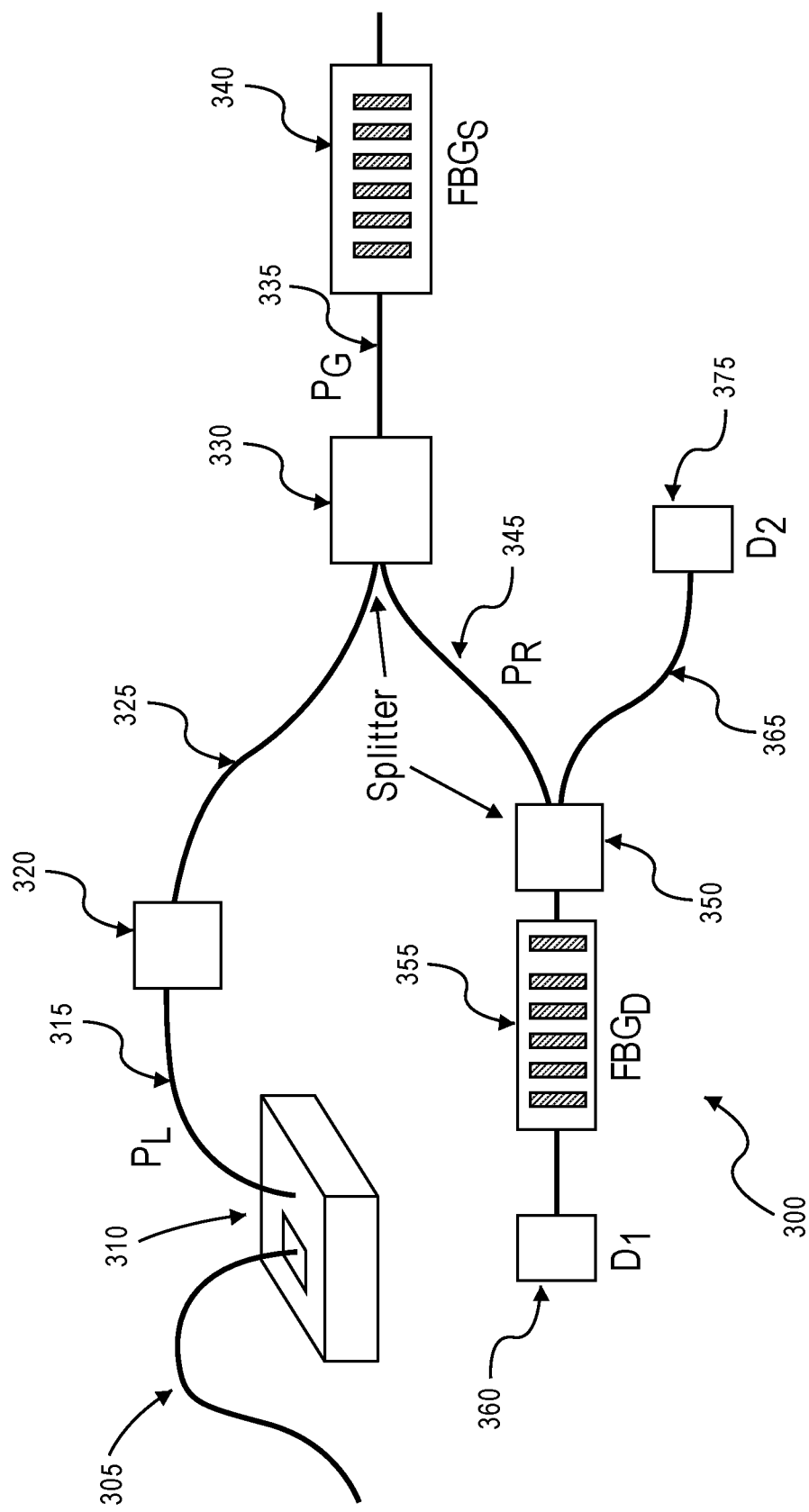
FIG. 3 depicts an exemplary fiber Bragg grating system comprising sensors and interrogator, in accordance with some embodiments of the disclosure provided herein.

FIG. 3 depicts an exemplary fiber Bragg grating sensing (FBGS) system 300 comprising sensors 360, 375 and interrogator 310, in accordance with some embodiments of the disclosure provided herein. Fiber Bragg gratings can be used as direct sensing elements for strain and temperature. They can also be used as transduction elements, converting the output of another sensor, which generates a strain or temperature change from the measured, for example fiber Bragg grating gas sensors use an absorbent coating, which in the presence of a gas expands generating a strain, which is measurable by the grating. Technically, the absorbent material is the sensing element, converting the amount of gas to a strain. The Bragg grating then transduces the strain to the change in wavelength.

Fiber Bragg gratings are finding uses in instrumentation applications such as seismology, pressure sensors for extremely harsh environments, and as downhole sensors in oil and gas wells for measurement of the effects of external pressure, temperature, seismic vibrations and inline flow measurement. As such they offer a significant advantage over traditional electronic gauges used for these applications in that they are less sensitive to vibration or heat and consequently are far more reliable. In the 1990s, investigations were conducted for measuring strain and temperature in composite materials for aircraft and helicopter structures.

Heretofore, FBGS systems have been costly and delicate exhibiting a large footprint. Specifically, interrogation sources typically require a source which can quickly sweep numerous frequencies and/or complex detection devices, such as, optical spectrum analyzers (OSAs). The inventor of the present disclosure has recognized a need for FPGS systems which are robust, simple, and inexpensive while maintaining a small footprint.

Turning to FIG. 3, the present disclosure contemplates a novel FBGS system 300 comprising a broadband light source 310, one of more fiber splitter/couplers and a plurality of optical detectors 360, 375. In one or more embodiments, a controller (not shown) controls a broadband light source via current fed from conductive element 305. In the present embodiment, the broadband light source 310 is a light emitting diode (LED) couple to a fiber 315. The light is launched from an LED directly into the fiber 315 placed extremely close to the LED surface. In some embodiments, the packaging described in the U.S. patent incorporated by reference allows us to directly place the fiber very close to the LED and/or laser surface.

The efficiency of coupling from LED into a single mode fiber is quite small. For the case of proximity coupling we can estimate it as:

$$\eta_{fib} = \left(\frac{7 \text{ um}}{150 \text{ um}}\right)^2 \text{(Area ratio)} \frac{\pi (7.\text{Degree})^2}{\pi} \text{(Angular Accptance)}$$

And for the launched power we have:

$$P_L = I_{led} \eta_{LED} \eta_{fib}$$

The above equation gives us roughly 10 nA/mA for a typical LED in the near infrared (NIR). The inventor has recognized that despite the poor coupling, the power transmitted, $P_L$, is suitable as will described in greater detail later in the disclosure.

Fiber 315 is removable attached to coupler 320. In one or more embodiments, this feature allows for greater portability and flexibility in the sale and application of the system.

The coupler 320 is also mechanically attached fiber 325 which then feeds light into coupler/splitter 330.

After the coupler/splitter 330, only ½ of the light coupled into the fiber reaches the sensing FBG named $FBG_S$ 340 via fiber 335. Since LED is a broadband light source and $FBG_S$ 340 reflects a small portion of the incident light spectrum (whose wavelength depends on the temperature, strain etc.), we estimate the total intensity of the reflected light from the $FBG_S$ 340 and into the detection system as:

$$P_G = \frac{1}{2} P_L$$

And, $$P_R = \frac{1}{2} P_G \left(\frac{\delta \lambda_{FBG_S}}{\Delta \lambda_{LED}}\right)$$

where, $P_G$ is the power incident on the $FBG_S$ 340 after the coupler/splitter 330 and $P_R$ is the power of the reflected pulse from $FBG_S$ 340 after the splitter/coupler 330 but before incidence upon $FBG_D$ 355 and splitter/coupler 350.

In the present embodiment, $FBG_S$ 340 is a uniform fiber Bragg grating and $FBG_D$ 355 is a chirped fiber Bragg grating. One skilled in the art will understand and appreciate that splitter/couples 330, 350 are functionally different depending on incident direction. That is, in one direction light is coupled with another fiber, whereas the other direction splits the light into two egress fibers at the distal end.

Coupler/splitter 350 couples the light from fiber 345. Light propagating through coupler/splitter 350 gets filtered by passing though $FBG_D$ 355. Those in the art can appreciated that the chirped $FBG_D$ 355 acts like a band pass filter (or low/high pass filters on the sidebands). Thus, the received portion of the broadband LED incident upon photodetector D1 360 will be used as a reference. A portion of $P_R$ is reflected at $FBG_D$ 350. This is the interrogated measurement which passes the light over fiber 365 to photodetector D2 375. The specifics of the in how these are used for calculation purposes will be discussed later in the disclosure.

Figure 4:
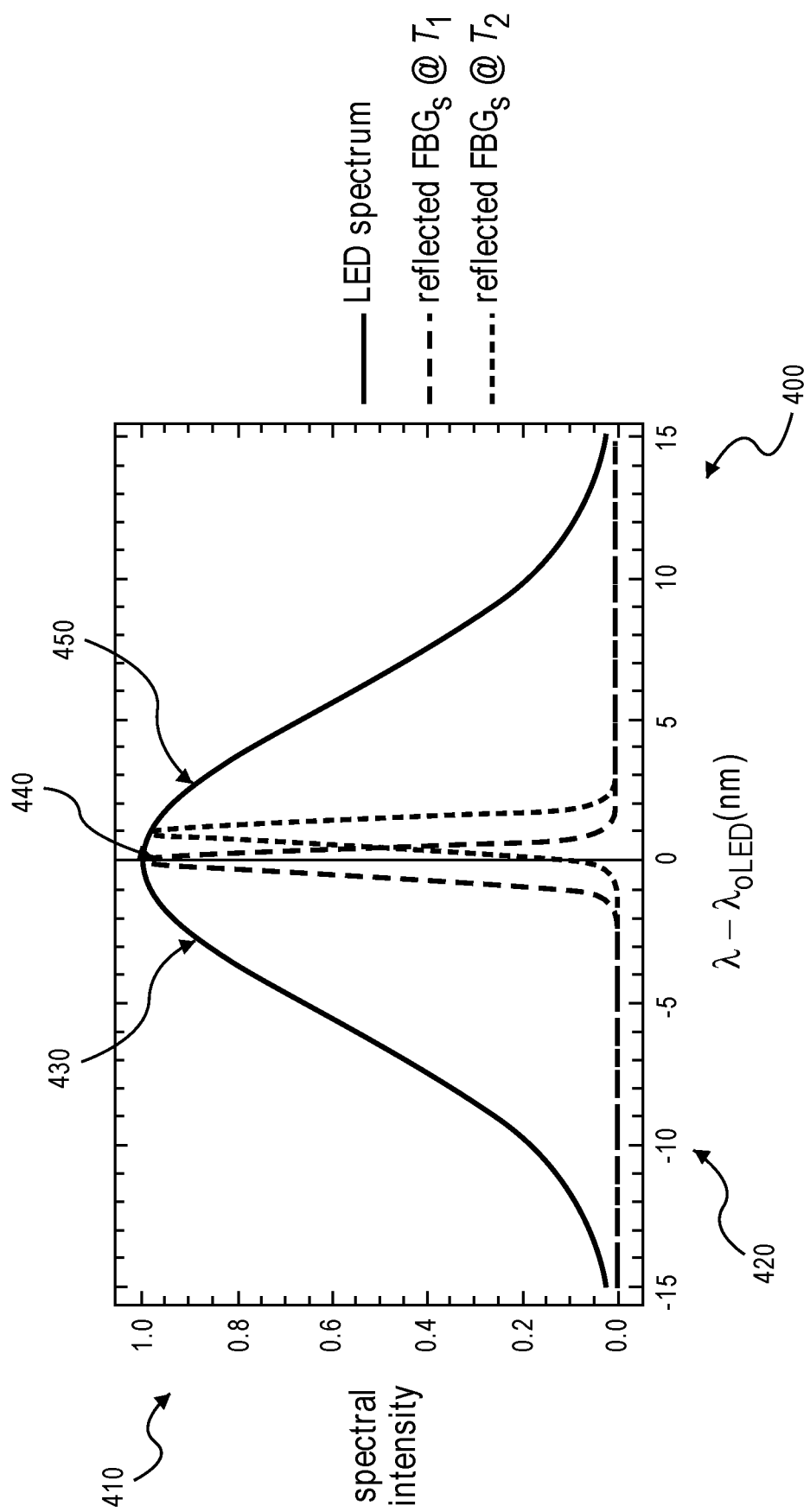
FIG. 4 illustrates exemplary spectra from the source and resultant reflections at two different temperatures, in accordance with some embodiments of the disclosure provided herein.

FIG. 4 illustrates exemplary spectra 400 from the source and resultant reflections at two different temperatures, in accordance with some embodiments of the disclosure provided herein. The bandwidth of the LED's spectrum 430 is of the order of 20-100 nm depending on the LED type while the bandwidth of the reflected light can be tuned from fraction of a nm to 10's of nm.

In general, this ratio of bandwidths will be of the order of 1-5%. Thus, very conservatively, the reflected light into the detector system to the LED has effective efficiency of 25-100 pA/mA (included the detector responsivity of ~0.25-1 A/W). This is illustrated in FIG. 4.

FIG. 4 shows a typical LED spectrum 430 in a solid line. At a first temperature, $T_1$, reflected light will be centered at $\lambda - \lambda_{oLED} = 0$. At a second temperature, $T_2$, reflected light will be centered at $\lambda - \lambda_{oLED} = 1$ nm. It is this transition which is the basis for strain and/or temperature measurement and analysis.

Figure 5:
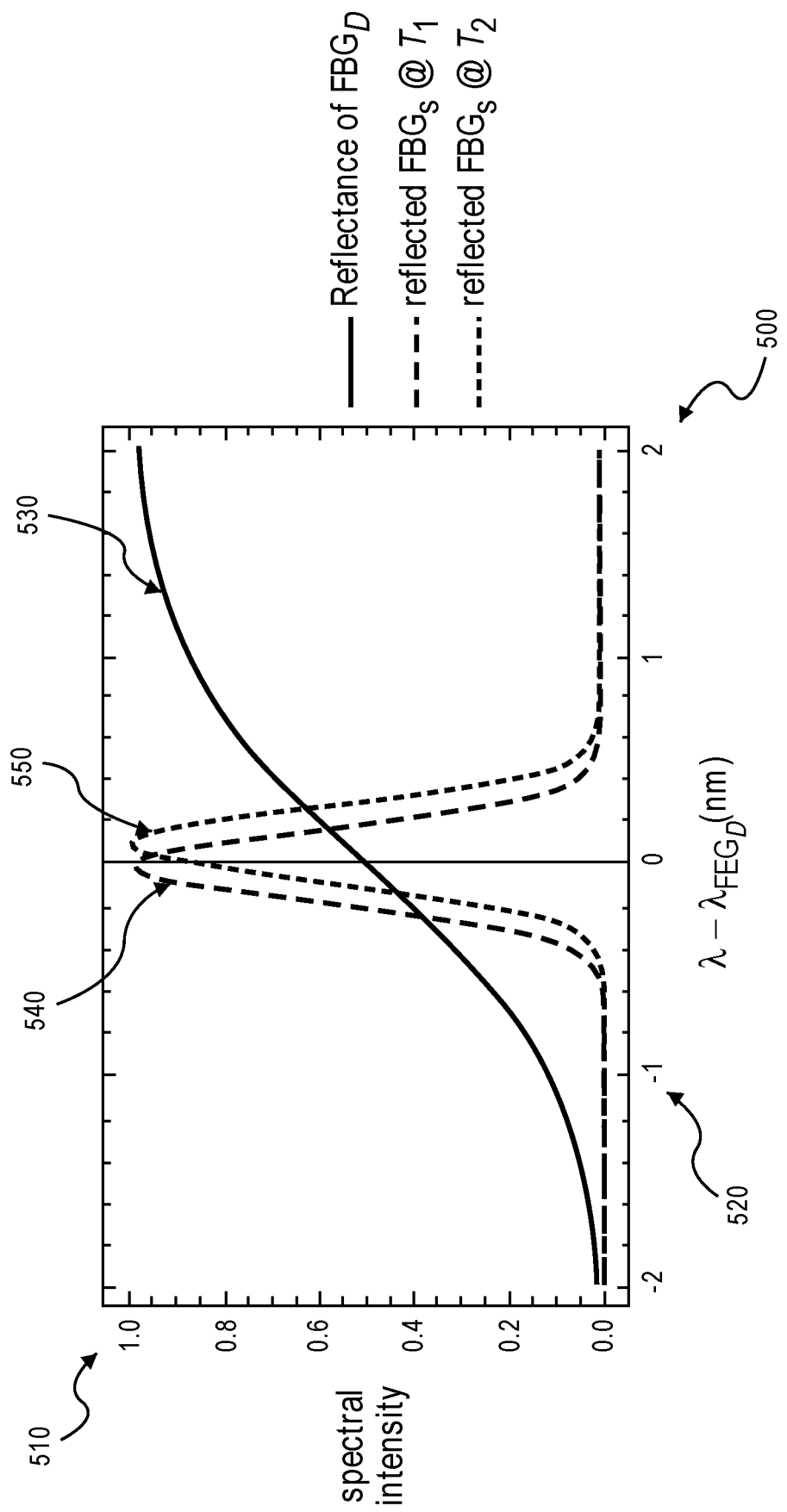
FIG. 5 illustrates exemplary spectra from resultant reflections at two different temperatures juxtaposed to broad band response of an exemplary chirped fiber Bragg grating fiber, in accordance with some embodiments of the disclosure provided herein.

FIG. 5 illustrates exemplary spectra from resultant reflections at two different temperatures juxtaposed to broad band response of an exemplary chirped fiber Bragg grating fiber, in accordance with some embodiments of the disclosure provided herein. The spectral graph 500 represents the spectral intensity 510 as a function of wavelength 520.

In the present embodiment, the solid line represents a typical reflectance spectrum from broadband light 530. The detector system itself will consist of an FBG with a reflectance profile that is quite broad and covers the region of interest. The profile of which is shown in FIG. 5. These type of broad reflectance profiles can be constructed by using a chirped FBG, as in the present embodiment with $FBG_D$.

Reflectance curve 540 represents bandwidth centered at a normalized wavelength at lambda 0 at a first temperature. Since the reflectance spectrum from broadband light 530 and Reflectance curve 540 are known, these will be used as reference. Reflectance curve 550 represents bandwidth centered at a normalized delta wavelength at lambda~0.2 at a second temperature. Since the reflectance spectrum from broadband light 530 is known, reflectance curve 550 will be used with the reference calculation to estimate a lambda resulting from temperature, strain, etc., as previously described.

Figure 6:
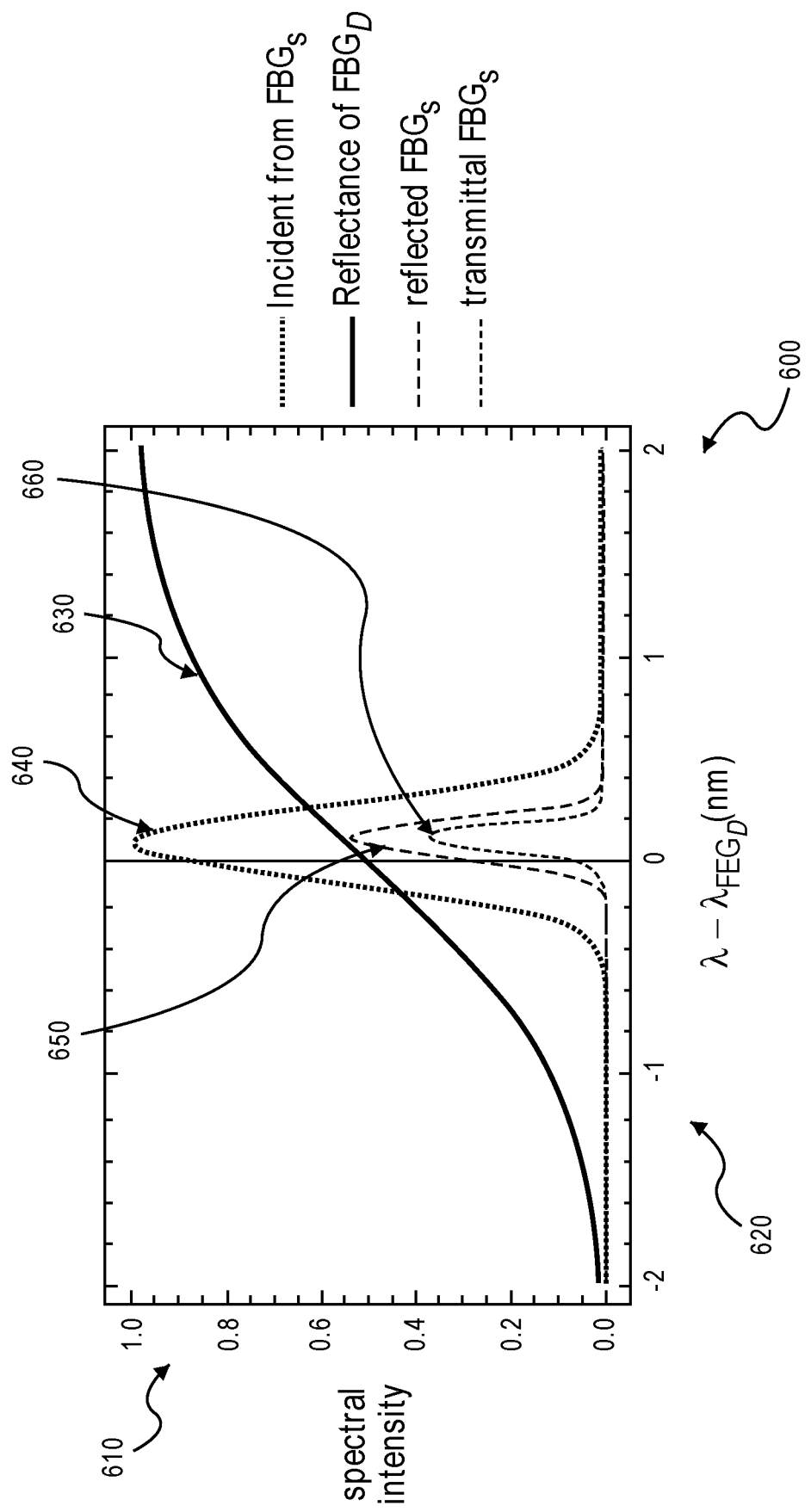
FIG. 6 demonstrates the decomposition of incident exemplary spectra on an exemplary chirped fiber Bragg grating juxtaposed to broad band response thereof, the decomposition comprising transmission and reflection, in accordance with some embodiments of the disclosure provided herein.

FIG. 6 demonstrates the decomposition of incident exemplary spectra 600 on an exemplary chirped fiber Bragg grating juxtaposed to broad band response thereof, the decomposition comprising transmission 660 and reflection 650, in accordance with some embodiments of the disclosure provided herein. The spectral graph 600 represents the spectral intensity 610 as a function of wavelength 620.

As can be appreciated by on skilled in the art, this chirped $FBG_D$ reflects wavelengths under the solid curve—albeit at attenuated levels at the edges. This is called edge detection. The remaining power gets transmitted through $FBG_D$ and detected at $D_1$ (see FIG. 4 for reference). The analog of the chirped FBG can be analyzed as a low pass filter in the frequency domain in the present disposition in the reflected direction.

FIG. 6 illustrates the filtering properties of $FBG_D$ (solid line 630). Light incident on $FBG_D$ (top dashed line 640) gets decomposed into light reflected 650 and transmitted 660 ($2^{nd}$ and $3^{rd}$ dashed lines, respectively). It can be seen that power is conserved and the reflected power is a function of the edge effects of the chirped $FBG_D$. The remaining power is transmitted and detected at $D_1$. In one or more embodiments, the detectors are photon detectors (photodetector) in the infrared or near infrared (NIR) spectra. In other embodiments, detector are thermal detectors. However, any detector is not beyond the scope of the current invention.

As one can see, the ratio of intensity on the two detectors, D1 360, D2 375 directly measures the wavelength of the reflected light from the sense FBG. A ratio such as:

$$R = \frac{I_{D1} - I_{D2}}{I_{D1} + I_{D2}}$$

Is independent of the LED's intensity variations as well as small changes in the wavelength spectrum. This ratio dies depend on the $FBG_D$'s transfer characteristics which must be made stable by design.

In another note, it is demonstrated that $FBG_D$ itself can be monitored and construct another "ratio of ratio" making it robust of the small changes in $FBG_D$. The detecting FBG can be replaced by any filter including a grating or thin film optical filter.

Since we need to resolve wavelength shifts of the order of 10's pm (a good temperature sensing FBG is ~10-15 pm/K), we can now estimate the SNR requirement. The change in the intensity of the two detectors because of the small shift in the wavelength of the input light is:

$$\delta I = \frac{dR}{d\lambda}\left(\frac{\delta \lambda_s}{\delta T}\right)\Delta T P_R$$

While temperature as an exemplary parameter, it can be replaced by any other physical parameter that FBG is sensitive to. The term $$\frac{dR}{d\lambda}$$

represents the slope of the $FBG_D$ and $$\frac{\delta \lambda_s}{\delta T}$$

represents the sensitivity of the sense FBGs. Again, let us make a quick demonstrative estimate.

Since the total change in the wavelength of the reflected light may be of the order of a few nm (or 100's of K for temperature) we can safely set $$\frac{dR}{d\lambda} \sim 0.1/nm \dots$$

Thus, for a 1K resolution, we have:

$$\delta I_{1K} \sim \left(\frac{0.1}{nm}\right)\left(\frac{0.01\ nm}{K}\right)\left(\frac{1}{2}\right)\left(\frac{25\ pA}{mA}\right) \sim 10 \frac{fA}{mA_{LED}K}$$

It is noted that another factor of ½ from connectors etc. is included and used to demonstrate the smallest (most conservative) estimated reflected power from the sense FBG. Thus, we need a receiver system whose noise floor is of the order of 0.1-1 pA-rms as we can easily pump 100 mA into the LED.

This is well within the capability of an exemplary analog front end (AFE) with a measurement bandwidth (BW) of the order of 10's of Hz. This is fast enough. In fact, given how conservative these estimates are, various optimizations from the LED to FBG's to coupling from LED to the fiber allows us another 2-3 orders of magnitude improvement over time. This can be traded off for higher BW of measurement or more sensitive measurement. The inventor of the present disclosure asserts 60-80 dB of measurement SNR can be achieved with sufficiently low noise to make the system feasible.

In future, the detection system can be replaced by AWG or array waveguide grating to provide very compact spectrometer for multiple wavelengths monitored simultaneously. These are not beyond the scope of the current invention.

Figure 7:
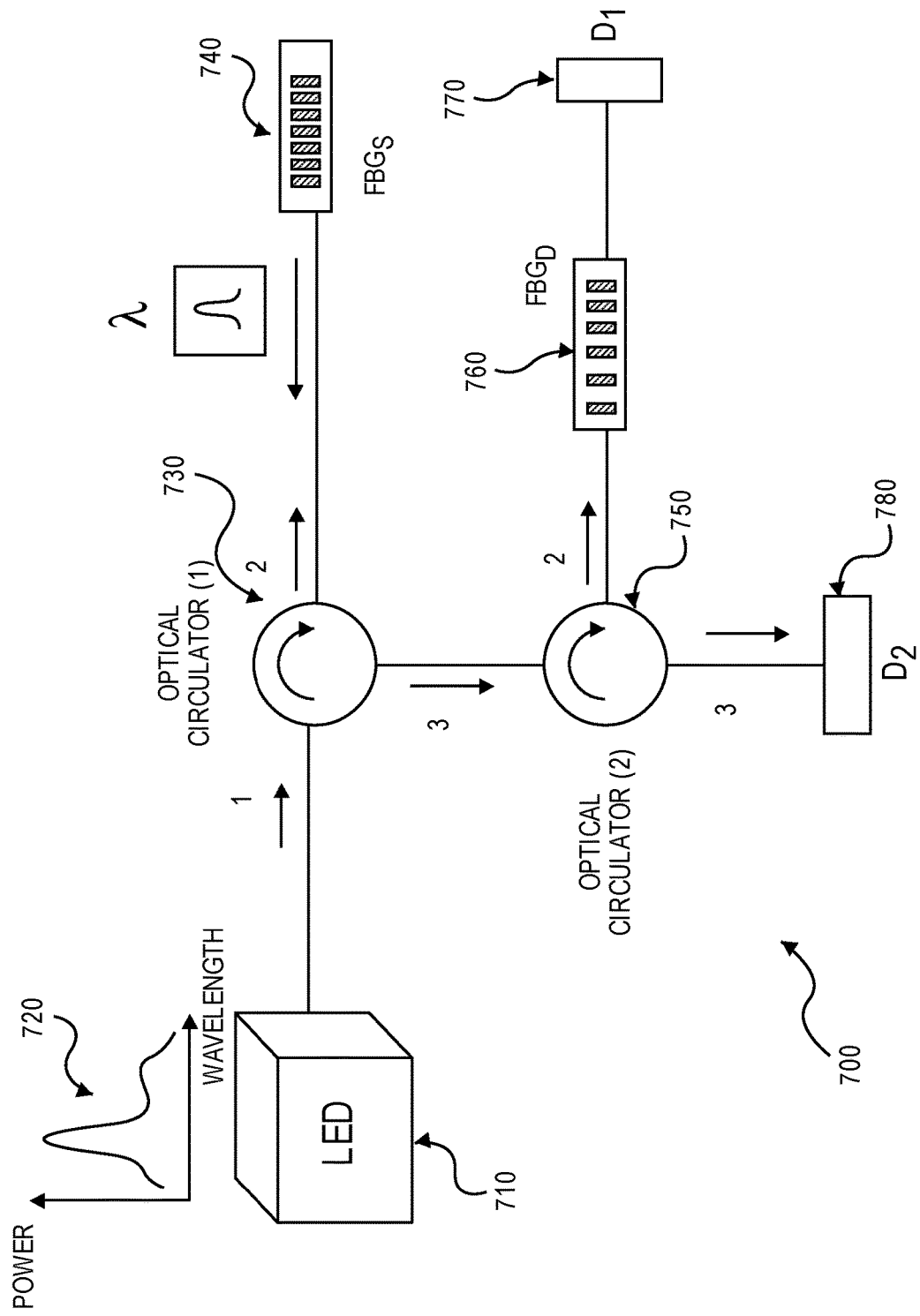
FIG. 7 depicts an exemplary fiber Bragg grating system comprising sensors, interrogator, and optical circulators, in accordance an alternate embodiment of the disclosure provided herein.

FIG. 7 depicts an exemplary fiber Bragg grating system 700 comprising sensors 770, 780, interrogator 710, and optical circulators 730, 750, in accordance an alternate embodiment of the disclosure provided herein. In the present embodiment, splitter/couplers are replaced with optical circulators 730, 750, which has the property to conserve power but greatly increases the complexity and cost. However, any suitable optical device, e.g., polarizing beam splitter, half-wave plate, half silvered mirror, etc., is not beyond the scope of the present invention.

In the present embodiment, $FBG_S$ 740 is a uniform fiber Bragg grating and $FBG_D$ 760 is a chirped fiber Bragg grating. One skilled in the art will understand and appreciate that optical circulators 730, 750 are functionally different depending on incident direction. That is, in one direction light is coupled with another fiber, whereas the other direction splits the light into two egress fibers at the distal end.

Turning to FIG. 7, the present disclosure contemplates a novel FBGS system 700 comprising a broadband light source 720, one of more optical circulators 730, 750 and a plurality of optical detectors 740, 780. In one or more embodiments, a controller (not shown) controls a broadband light source via current fed or other suitable circuit. In the present embodiment, the broadband light source 720 is a light emitting diode (LED) couple to a fiber. The light is launched from an LED 710 directly into the fiber placed extremely close to the LED surface. In some embodiments, the packaging described in the U.S. patent incorporated by reference allows us to directly place the fiber very close to the LED and/or laser surface.

After the optical circulator 730, light coupled into the fiber reaches the sensing FBG named $FBG_S$ 740. Since LED is a broadband light source and $FBG_S$ 740 reflects a small portion of the incident light spectrum (whose wavelength depends on the temperature, strain etc.), we estimate the total intensity of the reflected light from the $FBG_S$ 740 and into the detection system, similarly as previously described with or without of a ½ factor.

Light propagating through optical circulator 750 gets filtered by passing though $FBG_D$ 740. Those in the art can appreciated that the chirped $FBG_D$ 760 acts like a band pass filter (or low/high pass filters on the sidebands). Thus, the received portion of the broadband LED incident upon photodetector D1 770 will be used as a reference. A portion of $P_R$ is reflected at $FBG_D$ 760. This is the interrogated measurement which passes the light over fiber to photodetector D2 780.

Figure 8:
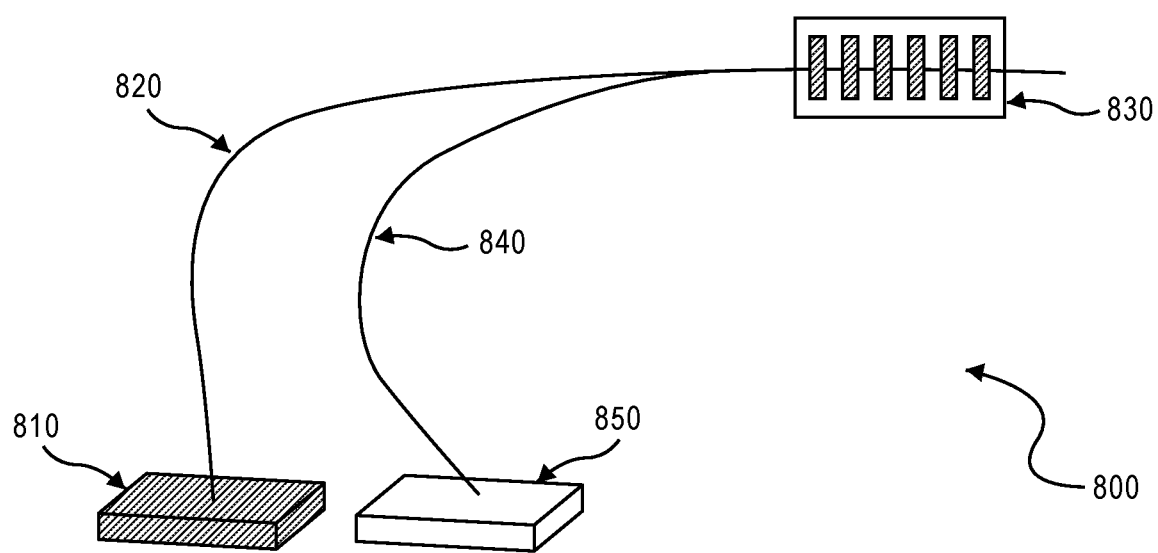
FIG. 8 depicts an exemplary fiber Bragg grating system comprising sensors and interrogator, in accordance with some embodiments of the disclosure provided herein.

FIG. 8 depicts an exemplary fiber Bragg grating system 800 comprising sensors 850 and interrogator 810, in accordance with other embodiments of the disclosure provided herein. In the simplest embodiment, the inventor has envisioned the implementation of a prefabricated system to be marketed to previously laid FBG in various applications, e.g., aero/astro, etc.

In the present embodiment, the interrogator 810 is an LED light source and current controller. Light is efficiently coupled into fiber 820 and delivered to $FBG_S$ 830. Reflected narrow band light is reflected into fiber 840, while power transmitted power through $FBG_S$ 830 is absorbed and/or attenuation in a lossy medium.

Detector platform 850 receive the reflected light from 840. Detector platform 850 comprises photodetectors and an optical filter pursuant to the present disclosure. That is, in the present embodiment, optical coatings are used to reconcile the reflected intensity with the overlap of the filter profile. This is known in the art as edge detection. The present embodiment relies upon the profiles of the $FBG_S$ 830 and the optical coating to make such an empirical determination.

Figure 9:
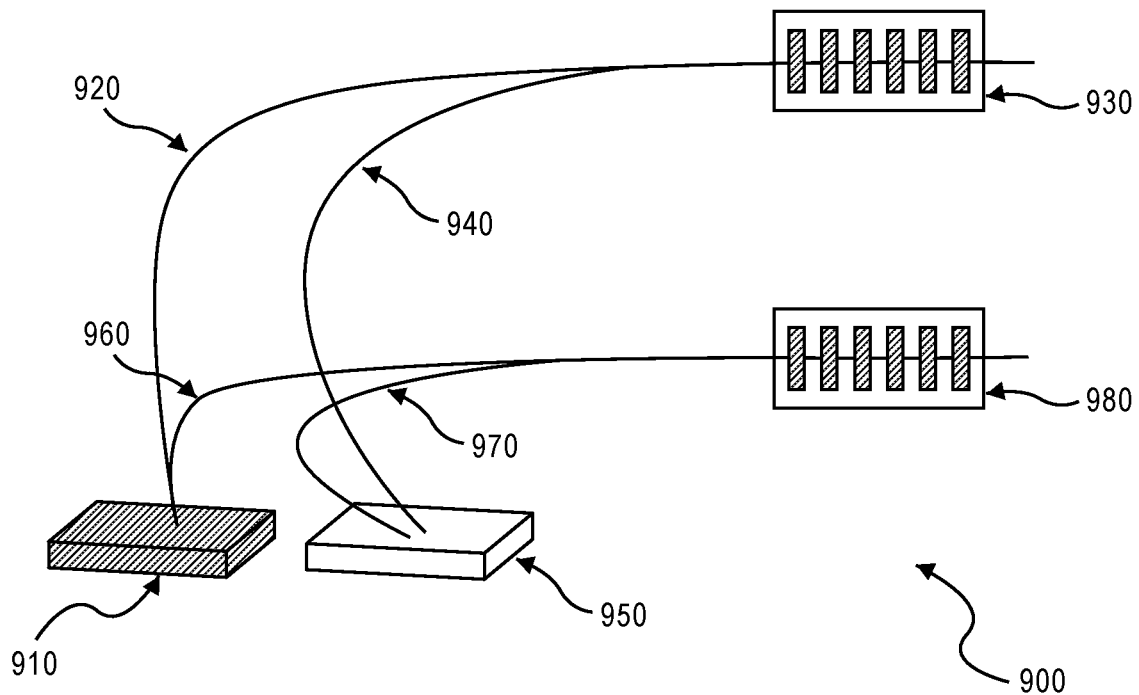
FIG. 9 depicts an exemplary fiber Bragg grating system comprising sensors, interrogators, an interrogated FBG and reference FBG, in accordance with some embodiments of the disclosure provided herein.

FIG. 9 depicts an exemplary fiber Bragg grating system 900 comprising sensors 950, interrogators 910, an interrogated $FBG_S$ 930 and reference $FBG_D$ 930, in accordance with some embodiments of the disclosure provided herein. Light is efficiently coupled into fiber 920 and delivered to $FBG_S$ 930. Reflected narrow band light is reflected into fiber 940, while power transmitted power through $FBG_S$ 930 is absorbed and/or attenuation in a lossy medium.

Light is equally efficiently coupled into fiber 960 and delivered to $FBG_D$ 980. $FBG_D$ 980 is used as a reference. In the present embodiment, it divorces the need for the intimate correlation between a $FBG_D$ and optical filtering (coating). Reflected narrow band light is reflected into fiber 970, while power transmitted power through $FBG_D$ 980 is absorbed and/or attenuation in a lossy medium.

Detector platform 950 receives the reflected light from 940 and 970 and performs a much more accurate comparison using optical filters, overlap and edge detection. Detector platform 950 comprises photodetectors and an optical filter pursuant to the present disclosure. That is, in the present embodiment, optical coatings are used to reconcile the reflected intensity with the overlap of the filter profiles and the reference signal.

Figure 10:
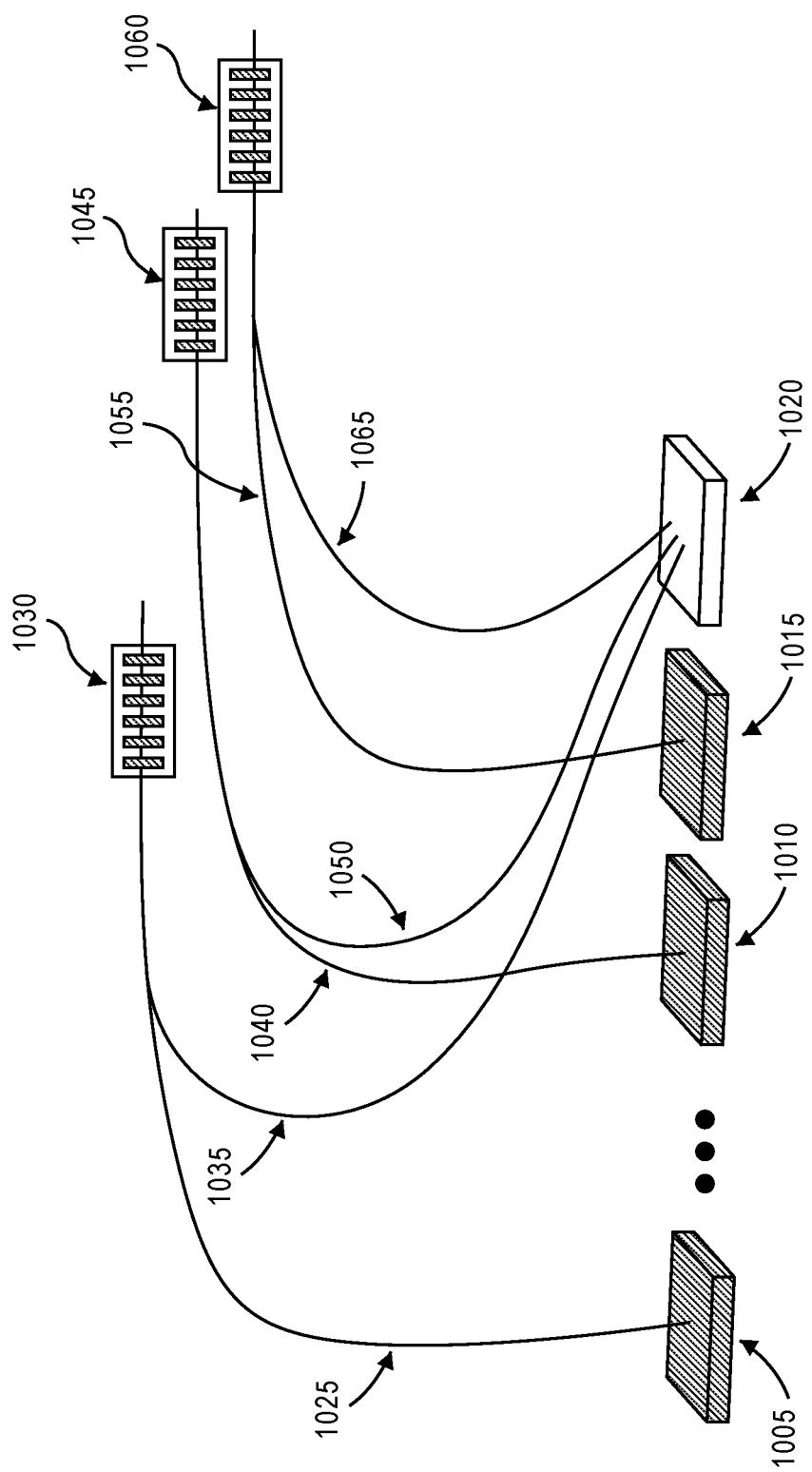
FIG. 10 depicts an exemplary fiber Bragg grating system comprising sensors, interrogators and a plurality of FBGs, in accordance with some embodiments of the disclosure provided herein.

FIG. 10 depicts an exemplary fiber Bragg grating system 1000 comprising sensors 1020, interrogators 1005, 1010, 1015 and a plurality of $FBG_S$ 1030, 1045, 1060 though a plurality of fibers 1025, 1040, 1055, in accordance with some embodiments of the disclosure provided herein. Reflectance signals are received from fibers 1035, 1050, 1065.

In the present embodiment, the interrogator is a plurality of light sources 1005, 1010, 1015 controlled by current controller. Light is efficiently coupled into fibers 1025, 1040, 1055 and delivered to $FBG_S$ 1030, 1045, 1060. Reflected narrow band light is reflected into fibers 1035, 1050, 1065, while power transmitted power through $FBG_S$ 1030, 1045, 1060 is absorbed and/or attenuation in a lossy medium.

Detector platform 1020 receive the reflected light from fibers 1035, 1050, 1065. Detector platform 1020 comprises photodetectors and an optical filter pursuant to the present disclosure. That is, in the present embodiment, optical coatings are used to reconcile the reflected intensity with the overlap of the filter profile. This is known in the art as edge detection.

In some embodiments, each of the plurality of light sources 1005, 1010, 1015 is a different wavelength. This allows the return fibers 1035, 1050, 1065 to be coupled together and reconciled by various filters at receiver 1020. In other embodiments, all light sources 1005, 1010, 1015 have the same wavelength but are pulsed at different time times temporally, which also allow coupling into the same return fiber. This can be reconciled in the time domain by an analog front-end.

In other embodiments, there is an assigned photodetector for each fiber light sources 1005, 1010, 1015. In this configuration, the wavelength can be the same or manifold. Each can be accounted for by the optical filters and analog front-end (AFE) calculations. These will be described in greater detail later in the disclosure.

Figure 11:
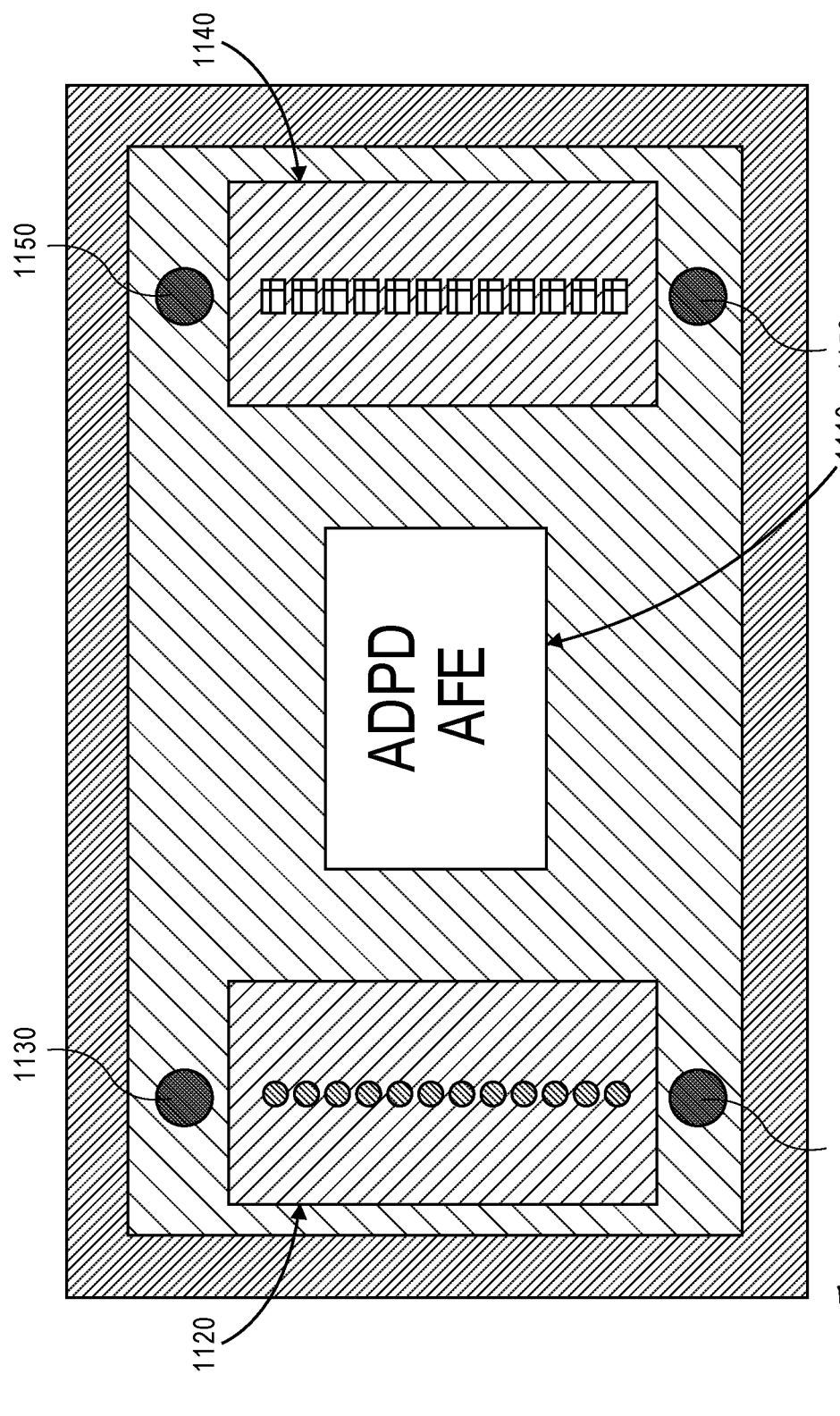
FIG. 11 illustrates packaging for an exemplary fiber Bragg grating system comprising sensors, interrogators and AFE, in accordance with some embodiments of the disclosure provided herein.

FIG. 11 illustrates packaging for an exemplary fiber Bragg grating system 1100 comprising sensors 1140, interrogators 1120 and AFE 1110, in accordance with some embodiments of the disclosure provided herein. The fiber Bragg grating system 1100 can be mechanically coupled via alignment posts/reliefs 1130, 1150.

Package contains entire measurement System. The ADPD AFE manages timing to drive the LEDs as well as read the signals on the photodiodes, providing I2C data output. An external microcontroller can be used to process data, converting photocurrent values into temperature shifts.

Figure 12:
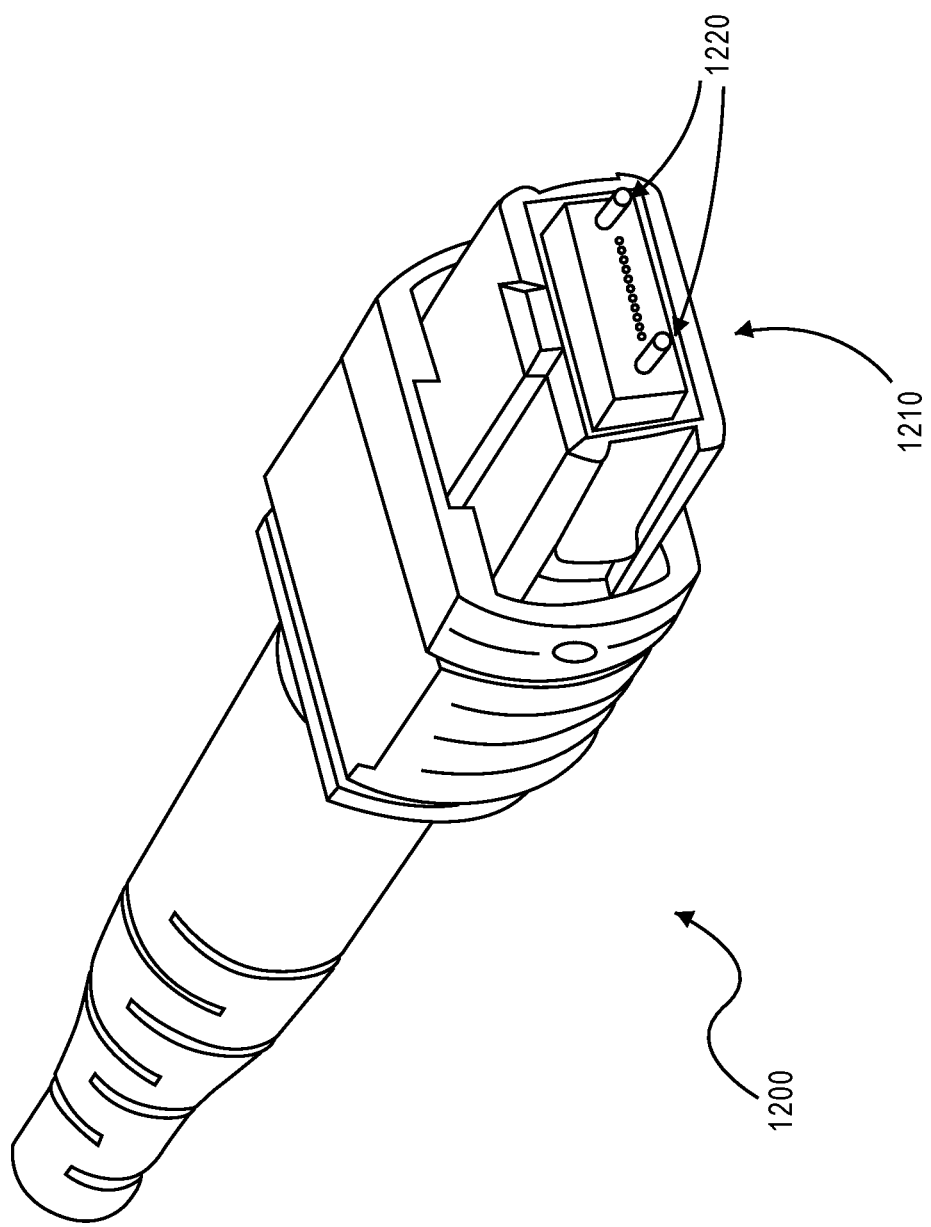
FIG. 12 illustrates packaging for an exemplary fiber Bragg grating fiber interface, in accordance with some embodiments of the disclosure provided herein.

FIG. 12 illustrates packaging for an exemplary fiber Bragg grating fiber interface 1200, in accordance with some embodiments of the disclosure provided herein. Fiber bundle 1210 can be mechanically couple to a previously disclosed AFE package using alignment posts 1220.

Connection to $FBG_S$ can be handled by a standard MTP style connector bundle. The connector holds a linear array of optical fibers and has two pins for alignment. ADI can leverage pre-existing packaging technology to easily allow connection to our package with 0.1 dB coupling loss. This also allows customers to provide their own fiber connectors, as opposed to ADI providing both the module and fiber optics.

Figure 13:
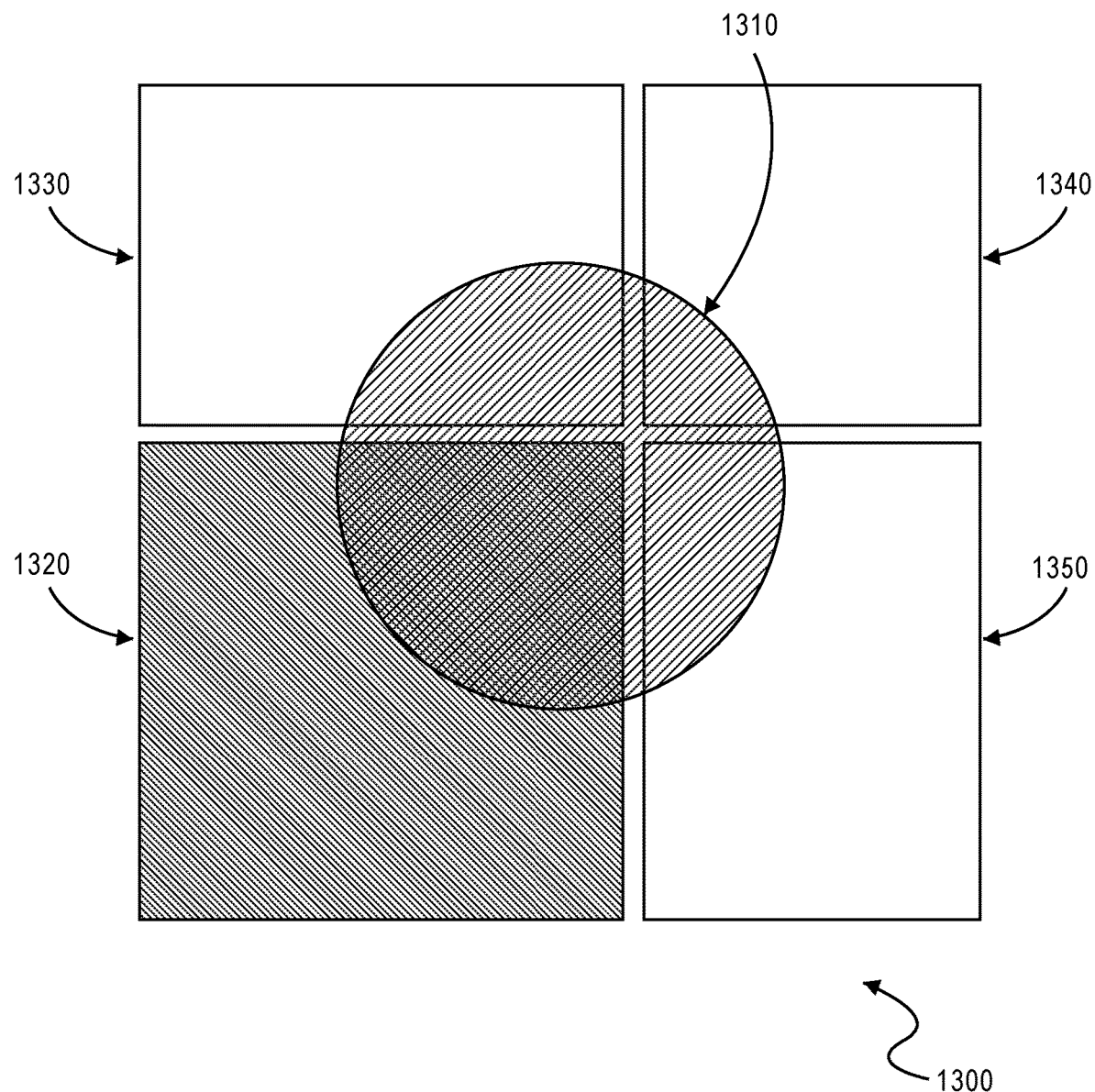
FIG. 13 illustrates packaging detection for an exemplary fiber Bragg grating system comprising sensors and optical filters, in accordance with some embodiments of the disclosure provided herein; and, FIG. 14 shows an exemplary fiber Bragg grating sensing filter, in accordance an alternate embodiment of the disclosure provided herein.

FIG. 13 illustrates packaging detection for an exemplary fiber Bragg grating sensing system 1300 comprising sensors and optical filters, in accordance with some embodiments of the disclosure provided herein. In the present embodiment, the coupled fibered is disposed at a distance away from the plurality of photodetectors to allow for the expansion of the fiber's beamwaist 1310.

Detectors 1330, 1340, 1350 are bereft of optical coating, in one or more embodiments. Photodetector 1320 has been subjected to an optical coating which serves the purpose of edge detection, as previously described.

In the preferred embodiment, the receiver is a differential measurement system. One photodiode is coated with a custom edge-pass filter, and the temperature will be determined by the ratio of the filtered to unfiltered power.

As seen in the proceeding alternate embodiment, light is incident on a filtered photodiode at an angle and, with clever packaging optics, the light reflected from the first photodiode would be captured by the second unfiltered photodetector.

To simplify design, however, the inventor of the present disclosure has determined that the fibers should be mounted a set distance away from the photodiodes, allowing the beam waist to expand and illuminate both the filtered and unfiltered photodiodes directly.

The largest problem with this sensing scheme is there is no way to separate local vibration of the fiber from a spectral shift due to temperature change. To mitigate this, two or additional photodiodes 1330, 1340, 150 will be used for each measurement. The two or more additional photodiodes will allow the device to measure the center location of the beam, and cancel out any vibrations.

Figure 14:
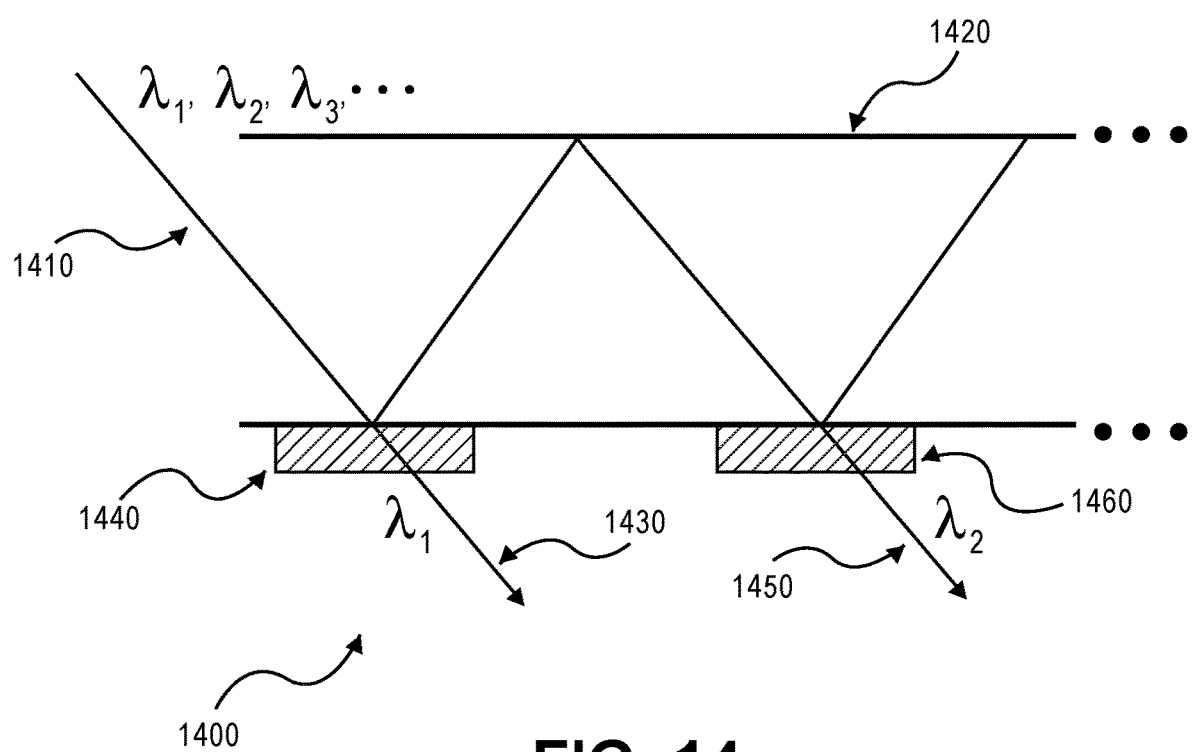

FIG. 14 shows an exemplary fiber Bragg grating sensing filter 1400, in accordance an alternate embodiment of the disclosure provided herein. In the present alternate embodiment, an add/drop filter is used instead of chirped FBG. In the present example, light 1410 comprising $\lambda_1$, $\lambda_2$, $\lambda_3$, etc. ingress the filter from the top at an oblique angle. $\lambda_1$ gets dropped out (filtered) 1430 through a dichroic mirror 1440 at the bottom of the wave guide 1420.

Consequently, $\lambda_2$ gets dropped out (filtered) 1450 through a dichroic mirror 1460 at the bottom of the wave guide 1420.

The remaining light propagate down the waveguide dropping subsequent wavelengths, $\lambda_2$, $\lambda_3$, etc. These filters are readily available and commonly used in the telecommunications industry with very resolutions and Os. However, any suitable optical device which can separate light is not beyond the scope of the present invention.

In one or more embodiments, the LED may be modulated by (at or about) one or more carrier frequencies, e.g., in the order of GHz. Frequency modulation (FM) is the encoding of information in a carrier wave by varying the instantaneous frequency of the wave. This will allow reduction in the interference in the noisy environments. In some embodiments, the modulator multiplies the source signal with the carrier signal, thereby convolving the two in the frequency domain.

The signals electrically transduced signals from the optical detectors can then demodulated by means and methods commonly known in the art. Specifically, the signal is deconvolved in frequency domain and filtered leaving on the source signal. Any of the standard modulation/demodulation technique can be used, for example, LED may be modulated at some freq. f and the signal at each of the detectors demodulated using standard demodulation techniques such as lock-in amplifier.

In some embodiments, fiber Bragg grating can be concatenated giving rise to multiport ports at different spatial locations. In one embodiment, these are uniform $FBG_S$ centered at various wavelengths, i.e., $\lambda_0$, $\lambda_1$, $\lambda_2$, etc. This concatenation can be disposed at $FBG_S$. In the context of the embodiment using modulation, each wavelength is modulated by a different carrier thereby greatly mitigating interference among wavelengths and carriers.

Correspondingly, a chirped concatenation can be used at $FBG_D$. In other embodiments, wavelength specific filters are used to split the signal reflecting back from $FBG_S$ into a tree configuration. The result is each color having its own photodetector. In the present embodiment frequency modulation is used, however any type of modulation, such as, amplitude modulation where in envelope acts as the encoding, is not beyond the scope of the present invention.

An aspect of the of the present disclosure is the source being an LED based light source with simple coupling. This has little to do with FBG or any particular optical transducer. Another aspect of the of the present disclosure is the read-out sensor that is relatively inexpensive, based on the disclosed architecture, which can directly measure multiple channels and is easily extensible to multiple systems. Another aspect of the of the present disclosure is low-cost as the edge filter can be either standard filters or FBG's themselves.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media)

(e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. A method for measuring the interrogation a fiber Bragg grating comprising:
   illuminating a first and second photodetector with light from a light source;
   disposing a filter between the light source and first photodetector, the filter centered a first wavelength;
   filtering light incident on the filter;
   measuring a filtered first intensity from the light incident on the first photodetector;
   measuring a second intensity from the light incident on the second photodetector; and
   calculating a change in the fiber Bragg grating using the measurement of the filtered first intensity and second intensity.

2. The method of claim 1, wherein the light source is an optical fiber.

3. The method of claim 2, wherein the light has been reflected from the fiber Bragg grating.

4. The method of claim 1 further comprising calculating a ratio of the filtered first intensity and second intensity.

5. The method of claim 4, wherein an analog front-end performs the calculation.

6. The method of claim 5, wherein the ratio is calculated by the following:

$$R = \frac{I_{D1} - I_{D2}}{I_{D1} + I_{D2}}$$

where I is the current received from two detectors $D_1$ and $D_2$.

7. The method of claim 1 further comprising:
   illuminating a third photodetector with light from the light source; and
   measuring a third intensity from the light incident on the third photodetector.

8. The method of claim 7 further comprising:
   illuminating a fourth photodetector with light from the light source; and
   measuring a fourth intensity from the light incident on the fourth photodetector.

9. The method of claim 8 further comprising calculating a center of a beam waist by comparing the intensities from at least two of the photodetectors.

10. The method of claim 9 further comprising calculating a ratio of intensities from at least two of first, second, third and fourth intensities.

11. The method of claim 9 further comprising calculating a change in the fiber Bragg grating using a plurality of the intensity measurements.

12. A system for detecting shifts in wavelengths comprising:
   an optical element centered at a second wavelength;
   a first photodetector;
   a second photodetector;
   a waveguide configured to pass light from the optical element to the first and second photodetectors; and
   a filter centered at a first wavelength disposed in a light path between the waveguide and the first photodetector;
   wherein the first photodetector measures the filtered light and the second photodetector measures unfiltered light.

13. The system of claim 12 further comprising an analog front-end configure to perform calculations on the measurements from the first and second photodetector.

14. The system of claim 13 wherein the calculations include estimating a ratio from the first and second photodetector.

15. The system of claim 14 wherein the ratio is calculated by the following:

$$R = \frac{I_{D1} - I_{D2}}{I_{D1} + I_{D2}}$$

where I is the current received from two detectors $D_1$ and $D_2$.

16. The system of claim 12 wherein the optical element is a fiber Bragg grating.

17. The system of claim 16 wherein the calculations include calculating a change in the fiber Bragg grating using the measurement of the first and second photodetector and predetermined properties of the filter.

18. The system of claim 13 further comprising a third photodetector configured to measure unfiltered light, wherein the first, second, and third photodetectors are disposed substantially in the same plane.

19. The system of claim 18 wherein the analog front-end is further configured to find a center of intensity by comparing the intensities from at least two of the photodetectors.

20. An apparatus for measuring the interrogation a fiber Bragg grating comprising:
   means for illuminating a first and second photodetector with light from a light source;
   means for disposing a filter between the light source and first photodetector, the filter centered a first wavelength;
   means for filtering light incident on the filter;
   means for measuring a filtered first intensity from the light incident on the first photodetector;
   means for measuring a second intensity from the light incident on the second photodetector; and
   means for calculating a change in the fiber Bragg grating using the measurement of the filtered first intensity and second intensity.

* * * * *